(12) United States Patent
Cewers

(10) Patent No.: US 8,664,832 B2
(45) Date of Patent: Mar. 4, 2014

(54) MECHANICAL TEMPERATURE COMPENSATION METHODS AND DEVICES

(75) Inventor: Göran Cewers, Limhamn (SE)

(73) Assignee: Mindray Medical Sweden AB, Sundbyberg (SE)

(*) Notice: Subject to any disclaimer, the term of this patent is extended or adjusted under 35 U.S.C. 154(b) by 252 days.

(21) Appl. No.: 13/106,644

(22) Filed: May 12, 2011

(65) Prior Publication Data

US 2011/0285246 A1    Nov. 24, 2011

Related U.S. Application Data

(60) Provisional application No. 61/345,756, filed on May 18, 2010.

(51) Int. Cl.
*H01L 41/053* (2006.01)
*H02N 2/00* (2006.01)
*F03G 7/06* (2006.01)

(52) U.S. Cl.
CPC .............. *H01L 41/053* (2013.01); *H02N 2/009* (2013.01); *F03G 7/06* (2013.01)
USPC .......................................... 310/328; 310/346

(58) Field of Classification Search
CPC .......... H01L 41/053; H02N 2/009; F03G 7/06
USPC ................................................... 310/328, 346
See application file for complete search history.

(56) References Cited

U.S. PATENT DOCUMENTS

| | | | |
|---|---|---|---|
| 3,671,108 A | 6/1972 | Kilgus | |
| 5,059,850 A | 10/1991 | Yoshimura et al. | |
| 5,222,049 A * | 6/1993 | Drumheller | 367/82 |
| 6,148,842 A | 11/2000 | Kappel et al. | |
| 6,784,599 B1 * | 8/2004 | Stoecklein et al. | 310/364 |
| 7,514,847 B2 | 4/2009 | Dick et al. | |
| 2008/0031091 A1 * | 2/2008 | Fripp et al. | 367/82 |
| 2009/0278631 A1 | 11/2009 | Goebel et al. | |

FOREIGN PATENT DOCUMENTS

| | | |
|---|---|---|
| DE | 10303855 A1 | 8/2004 |
| WO | 2005026529 A1 | 3/2005 |

* cited by examiner

*Primary Examiner* — Derek Rosenau
(74) *Attorney, Agent, or Firm* — Kory D. Christensen; Stoel Rives LLP

(57) ABSTRACT

The disclosure pertains to a device and a method for compensating for heat expansion effects in solid materials, as well as a method for manufacturing the device.

11 Claims, 3 Drawing Sheets

MECHANICAL TEMPERATURE COMPENSATION METHODS AND DEVICES

CROSS-REFERENCE TO RELATED APPLICATION(S)

This application claims the benefit of U.S. Provisional Application No. 61/345,756, filed May 18, 2010, which is incorporated herein by reference.

TECHNICAL FIELD

The following disclosure relates to mechanical temperature compensation.

SUMMARY OF THE INVENTION

Devices and methods for compensating for thermal expansion in solid materials, such as plastic, metal, or ceramics, as well as a method for manufacturing such devices, are disclosed.

DETAILED DESCRIPTION

Figure 1:
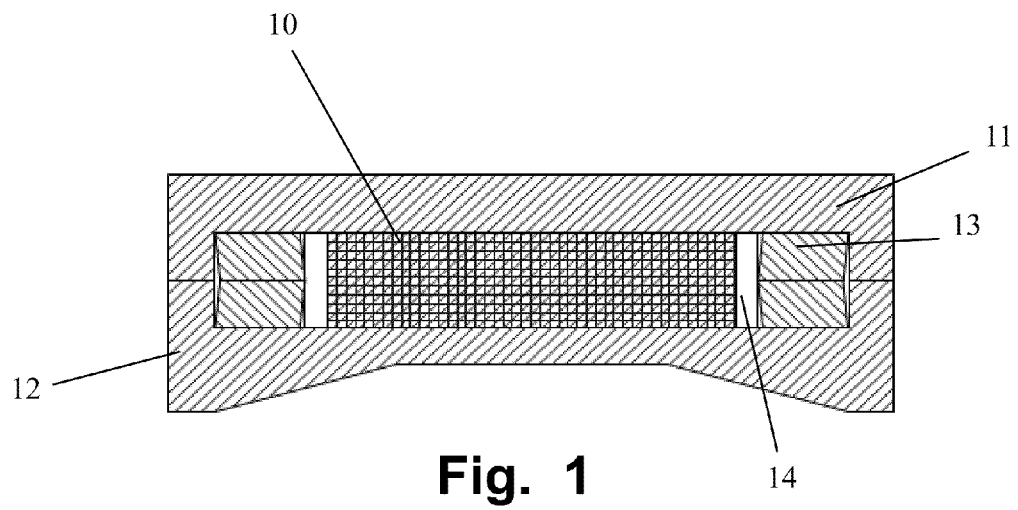
FIG. 1 is a schematic view of a device at its lowest working temperature.

When designing mechanical systems, it is common for components of different materials to be used based on specific requirements, such as hardness, fatigue properties, corrosion resistance, surface roughness, transparency, color, electrical properties, melting point, cost, etc.

When different materials are combined, the parts being used often have different coefficients of thermal expansion. In most cases, this does not cause any problems if the structure allows for these thermal expansions to occur without damaging the structure or impairing functionality. This can be achieved by having adequate tolerances that allow for the thermal effects, along with the construction having a structure and a material choice having as little impact as possible when temperature may impact functionality.

However, there are temperature critical structures where temperature compensation elements are required for satisfactory operation when temperatures are fluctuating. Such temperature critical structures can be used in devices for micro-positioning, controlling laser beams, microscope focusing (atomic, optical and ultrasound), manufacturing of semiconductors, sensors for micro-positioning, spectroscopy, and optical benches.

In micro-positioning, it is common for the positioning to be controlled by an actuator, such as a piezoelectric crystal. A piezoelectric crystal has an actuation range of approximately 0.1% of the crystal thickness, i.e., the actuation range is extremely small in relation to the crystal thickness. To obtain a greater motion, structures have been produced in the form of bimorphous crystals, which have two layers of piezo materials with opposite working directions. Bending is obtained in the same way as for bimetals by constructing the joined layers into beams. The piezo beam is heat stable, as it comprises materials with the same heat expansion coefficients throughout.

However, the disadvantage of piezo beams is that the force is limited by the fragility of the piezo ceramics.

Another method for obtaining greater motion using piezo technology is to connect a number of piezo elements in series forming a stack. This can be made in a similar manner to the manufacturing of ceramic multi-layer condensers. A piezo actuator having a length of several centimeters may be made in this way. If a stack is fastened at one end, the other end will move relative to its surroundings of the other end. The surroundings of the other end usually comprise the same material which is fastened in the end of the piezo stack. In order to obtain a relative motion that is influenced by the ambient temperature, the piezo stack and the surrounding material should have the same heat expansion coefficient. However, this is difficult to achieve, as the piezo material often has expansion coefficients of just a few ppm, and even a negative coefficient in some materials. The surrounding material must have the same coefficient, which highly restricts the possible choice of materials. Only certain special alloys and ceramic materials remain as possible options. These options are often unsuitable due to strength, manufacturing methods, corrosion properties, or high cost.

Another approach is for a second piezo stack to act as reference point to the first. This adds to the cost and places restrictions on mechanical design. Yet another method is to use special materials as a reference point. Still another method is to place an element with significant heat expansion in series with the piezo stack. The piezo stack in series with the compensation element could then be made to have the same heat expansion as the surrounding materials. This principle is described in U.S. Pat. Nos. 7,514,847 and 6,148,842.

U.S. Pat. No. 7,514,847 uses an aluminium body as a compensation component. As aluminium has relatively low heat expansion coefficient compared with ordinary construction materials, a larger body of this kind is needed, resulting in significantly increased dimensions and impaired response times.

U.S. Pat. No. 6,148,842 uses a closed container filled with oil as a compensation body. This solution provides a compact compensation body, as there are oils with high heat expansion coefficients. The disadvantage is that the oil must be enclosed hermetically in order to avoid leakage, resulting in high manufacturing costs.

Compensation methods using memory metal are described, e.g., in U.S. Pat. No. 5,059,850. However, this solution is beset by hysteretic problems, material choices, and high costs.

The disclosure provides devices and methods for temperature compensation with a body having a significantly greater heat expansion coefficient than metals and other common construction materials.

In a first aspect, a mechanical temperature compensation element is provided to compensate for heat expansion. In one embodiment, the element comprises a flat element with a first heat expansion coefficient, a housing with a second heat expansion coefficient different from the first heat expansion coefficient, an inclined (in relation to the flat element) linkage device, which mechanically connects the flat element and the housing. When the temperature changes, the flat element expands radially and the linkage device is moved radially, such that the radial expansion from the flat element is converted to an orthogonal movement (relative to the flat element), which raises or lowers the housing depending on the temperature of the temperature compensation element.

This design provides a mechanical device that may be used to mechanically compensate for temperate changes in temperature critical structures, such as for micro-positioning, controlling of laser beams, microscope focusing (atomic, optical, and ultrasound), semiconductor manufacturing, sensors for micro-positioning, spectroscopy and optical benches, or to compensate for the temperature-dependent stroke length of a piezo element.

In one embodiment, the temperature compensation is obtained by the flat material having a heat coefficient being higher or lower than an upper laying housing or a housing made of two opposed halves. When a temperature change occurs, the flat element is expanded radially, which results in a mechanical device executing a lever-like movement and raising and lowering the housing orthogonally relative to the flat element.

The flat element and the housing may have varying shapes in different embodiments. For example, they can either be circular, polygonal, or ellipsoid.

In one embodiment of the mechanical temperature compensation element, the linkage device comprises a disk element, such as a washer, with a rhomboidal cross-section, radial slits and/or separate segments with a rhomboidal cross-section.

The design of the mechanically linked device between the flat element and the housing results in the lever-like movement, which is caused by the flat element's temperature dependent radial change.

In another embodiment, the flat element has a heat expansion coefficient higher than that of the housing. This provides positive temperature compensation, which has a raising effect when the temperature increases. Examples of a material that may be used for the flat element is Zinc.

In yet another embodiment of the mechanical temperature compensation element, the flat element has a heat expansion coefficient lower than that of the housing. This provides negative temperature compensation, which causes the mechanical temperature compensation element to lower when the temperature increases.

In still another embodiment, the mechanical temperature compensation element may be connected in series to a piezo element. In a connection of this kind, the mechanical temperature compensation element is used to compensate for temperature dependent changes in the stroke length of the piezo element. However, a skilled artisan will recognize that the disclosed techniques may be used to provide temperature compensation in other temperature critical structures.

Another aspect of the disclosure includes a method for assembling the mechanical temperature compensation element, which includes the step of cooling down the flat element prior to assembly.

Yet another aspect of the disclosure includes a method for assembling the mechanical temperature compensation element, which includes the step of heating the housing prior to assembly.

These two aspects of the disclosure involve heating or cooling components so that a pressure fit occurs when the components are mounted and that the temperature of the components are controlled to the intended temperature compensation range.

Another aspect of the disclosure includes a method for mechanical temperature compensation of a temperature critical structure comprising a flat element having a heat expansion coefficient that is different from the heat expansion coefficient of its housing, which, at temperature changes, is expanded and thus presses on a mechanically linked (between the flat element and the housing) device raising or lowering the housing orthogonally relative to the flat element interacting with the temperature critical structure.

Yet another aspect of the disclosure provides a temperature compensation method, wherein a temperature compensation element is used as an element for compensating for heat expansion. In one embodiment, a flat element is expanded radially upon changes in temperature and an inclined linkage device is moved radially, whereupon the radial expansion of the flat element is converted to an orthogonal movement in relation to the flat element, raising or lowering a housing surrounding the flat element, depending on the temperature of the temperature compensation element.

Referring to FIG. 1, a device according to an embodiment of the disclosure may be provided by a disc 10 having relatively high heat expansion coefficient that is enclosed by a housing 11, 12. The housing 11, 12 has two parts enclosing the disc 10. In some embodiments, the housing comprises two discs, each having a cavity. The discs are mounted so that the cavities receive disc 10 inside the housing. Disc 10 is in tension with a linkage device 13, which can be a washer with rhomboidal cross-section, as shown in FIG. 1. The disc 10 has a high heat expansion coefficient compared to the housing 11, 12.

Figure 4:
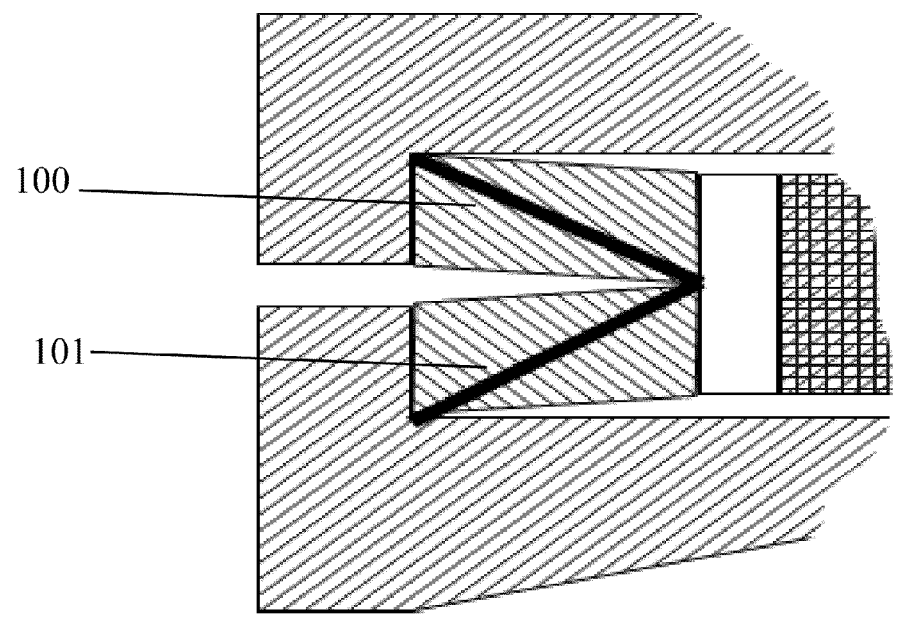
FIG. 4 is a detailed view of FIG. 2 illustrating a linkage device.

When the temperature increases, disc 10 expands more radially than along the axis, since the diameter of the disc is greater than thickness. Moreover, disc 10 expands more than the housing 11, 12, whereupon the linkage device 13 exposes housing 11, 12 to a radial pressure. In the exemplary embodiment, linkage device 13 comprises two rings with rhomboidal cross-section and exerts a radial pressure on housing 11, 12. The rhomboidal cross-section of linkage device 13 is given a function of an inclined supporting element (e.g., a strut) 100, 101, as illustrated in FIG. 4, with the diagonal lines in the cross-section of the linkage device 13. The radial movement caused by the heat expansion of disc 10 is converted in an axial movement having an amplification factor determined by the inclination of lines 100, 101, i.e., the design of the linkage device 13 being according to desired specifications and applications.

Figure 2:
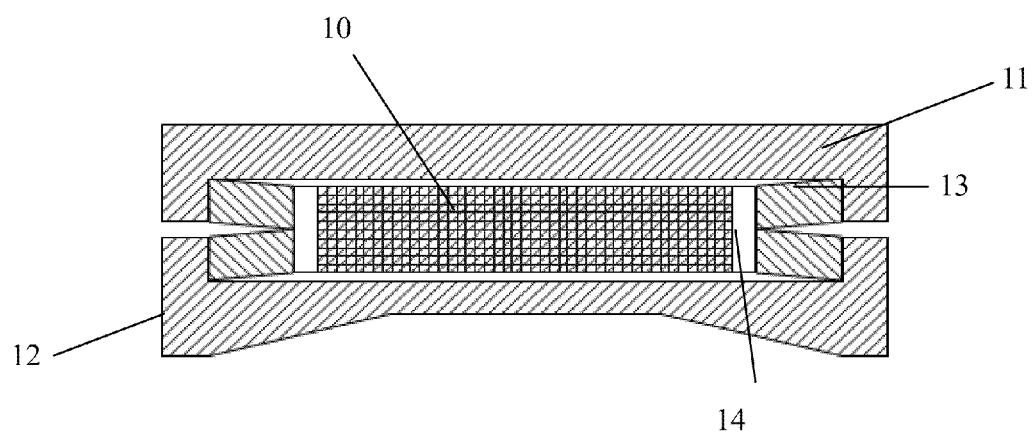
FIG. 2 is a schematic view of the device in FIG. 1 at its highest working temperature.

The device at the lowest working temperature is shown in FIG. 1 and the device at the highest working temperature is shown in FIG. 2. At typical working temperature, parts 11, 12 of the housing are separated by a distance of, e.g., half of what is illustrated in FIG. 2. At the same time, the linkage device 13 is only in contact with the disc 10 and housing 11, 12 at the corner of the opposing diagonals 100, 101 in FIG. 4. In this position, as well as the highest working temperature, the whole device is being held together as a continuous unit by pressure fit caused by radial pressure against the linkage device 13 from the disc 10.

In order for the device to withstand high axial counter forces, the radial surface of the disc 10 may be surrounded by a thin ring 14 made of a hard material. This prevents the shape of the disc 10 from being deformed, even if it consists of a material being softer than the housing. By choosing zinc as material for the disc 10 and stainless steel for the rest of the device, for example, a heat expansion coefficient of 150 ppm/degree may be obtained. This is approximately 10 times higher than most structural materials. By varying the angle of the rhomboidal shape of linkage device 13, the mechanical amplification, and thus the axial heat expansion coefficient, may be determined as desired.

Figure 5:
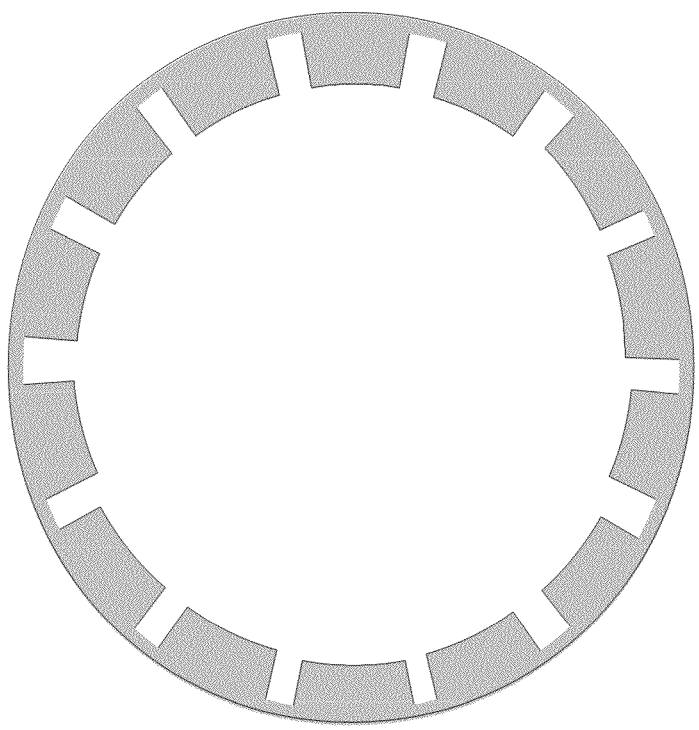
FIGS. 5 and 6 illustrate various embodiments of a linkage device.
Figure 6:
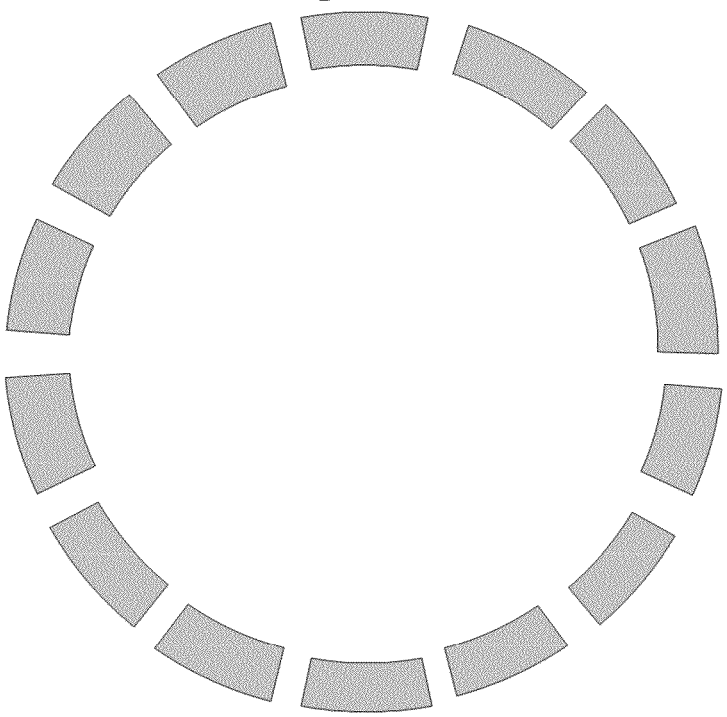

When the linkage device 13 is exposed to radial forces, it will exert a counter force on the disc 10. This will compress the disc by, in practice, a reduced heat expansion effect. In order to reduce this effect, linkage device 13 may be equipped with slits, as shown in FIG. 5, or may comprise loose segments, as shown in FIG. 6. Slits in linkage device 13 may comprise non-penetrating radial grooves.

Figure 3:
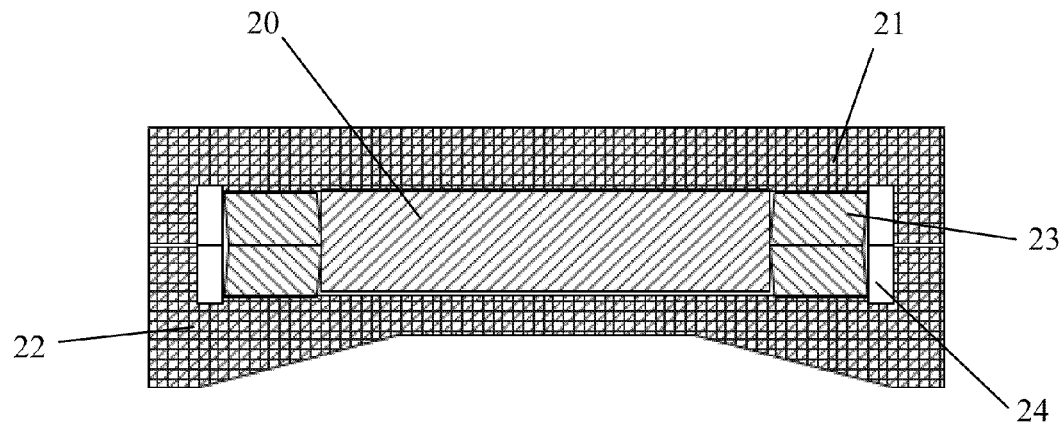
FIG. 3 illustrates a schematic view of a device in which negative temperature compensation is being obtained.

By using a material having a high heat expansion coefficient in housing 11, 12 and in the rest of the device material having a low heat expansion coefficient relative to it, as shown in FIG. 3, a negative heat expansion coefficient may be obtained.

Referring to FIG. 3, ring 24, forming a hard surface against housing 21, 22, may then be placed in a slightly different position compared to FIG. 2. Disc 20 and linkage device 23 are similar to disc 10 and linkage device 13 shown in FIG. 2.

In some embodiments, the parts used are circular, but the device is not restricted to these shapes. The circular shape may be changed to polygons, ellipses, or the like.

FIGS. 5 and 6 illustrate various embodiments of the linkage device. As shown in FIG. 5, linkage devices may be arranged in a continuous ring. Alternatively, as shown in FIG. 6, individual elements may be arranged in a circuit around the disc 10.

A manufacturing method for one embodiment of the above-described device is now described. As already mentioned, the entire device may be held together by a pressure fit. At temperatures lower than the working temperature range of the disc 10, all components can be mounted without difficulty.

One method for assembly is to cool down disc 10 to a low temperature prior to the assembly, e.g., in liquid nitrogen. After assembly, the device is exerted to axial pressure and is allowed to be temperature equalized until the device reaches its working temperature range, after which the pressure may be removed.

When an assembly of a device has a negative heat expansion coefficient, as shown in FIG. 3, the housing 21, 22 may be heated up instead, after which axial pressure is exerted on the device and the temperature is allowed to be equalized until the device reaches its working temperature range, after which the pressure can be removed.

Without further elaboration, it is believed that one skilled in the art can use the preceding description to utilize the present disclosure to its fullest extent. The examples and embodiments disclosed herein are to be construed as merely illustrative and not a limitation of the scope of the present disclosure in any way. It will be apparent to those having skill in the art that changes may be made to the details of the above-described embodiments without departing from the underlying principles of the disclosure described herein. In other words, various modifications and improvements of the embodiments specifically disclosed in the description above are within the scope of the appended claims. The scope of the invention is, therefore, defined by the following claims. The words "including" and "having," as used herein, including in the claims, shall have the same meaning as the word "comprising."

What is claimed is:

1. A mechanical temperature compensation element for use as a compensation element for heat expansion that occurs primarily in an axial direction and that is orthogonal to a radial direction, comprising:
 a flat element having a first heat expansion coefficient;
 a housing having a second heat expansion coefficient different from said first heat expansion coefficient;
 a linkage device, inclined in relation to said flat element, which mechanically connects said flat element and said housing such that a diagonal of the linkage device extends from a first contact point to a second contact point, said first contact point being located farther in the axial direction from the housing than the second contact point; and
 wherein, upon an increase in temperature, said flat element expands radially, forcing said linkage device to move radially and increasing the separation, in the axial direction, of the first and second contact points,
 whereby said radial expansion by said flat element is converted to movement in the axial direction, which raises or lowers said housing depending on the temperature of the temperature compensation element.

2. The temperature compensation element according to claim 1, wherein said housing is two opposed halves.

3. The temperature compensation element according to claim 1, wherein said flat element is one of a circular shaped disc or a polygon.

4. The temperature compensation element according to claim 1, wherein said housing is one of circular or polygon shaped.

5. The temperature compensation element according to claim 1, wherein said linkage device comprises a washer having a rhomboidal cross-section.

6. The temperature compensation element according to claim 1, wherein said linkage device comprises radial slits.

7. The temperature compensation element according to claim 1, wherein said linkage device comprises separate segments having a rhomboidal cross-section.

8. The temperature compensation element according to claim 1, wherein said heat extension coefficient of said flat element is higher than that of said housing.

9. The temperature compensation element according to claim 1, wherein said heat extension coefficient of said flat element is lower than that of said housing.

10. The temperature compensation element according to claim 1, wherein said flat element is made of zinc.

11. The temperature compensation element according to claim 1, wherein said temperature compensation element is connected in series to a piezo element.

\* \* \* \* \*